(12) United States Patent
Shima et al.

(10) Patent No.: US 6,473,288 B2
(45) Date of Patent: Oct. 29, 2002

(54) ADHESIVE SHEET AND ELECTROSTATIC CHUCKING DEVICE

(75) Inventors: Takeshi Shima, Shimizu (JP); Tadao Matsunaga, Shimizu (JP); Mitsuaki Horiike, Shimizu (JP); Toshiyuki Yamamoto, Shimizu (JP)

(73) Assignee: Tomoegawa Paper Co., Tokyo (JP)

( * ) Notice: Subject to any disclaimer, the term of this patent is extended or adjusted under 35 U.S.C. 154(b) by 0 days.

(21) Appl. No.: 09/862,297

(22) Filed: May 23, 2001

(65) Prior Publication Data

US 2002/0004134 A1 Jan. 10, 2002

(30) Foreign Application Priority Data

May 25, 2000 (JP) ........................................ 2000-154248

(51) Int. Cl.⁷ ............................................... H02N 13/00
(52) U.S. Cl. ...................................... 361/234; 279/128
(58) Field of Search ................................ 361/230, 233, 361/234; 279/128; 269/8, 903

(56) References Cited

U.S. PATENT DOCUMENTS 5,583,736 A * 12/1996 Anderson et al. ........... 279/128

FOREIGN PATENT DOCUMENTS

JP          05-347352           12/1993

* cited by examiner

*Primary Examiner*—Shawn Riley
(74) *Attorney, Agent, or Firm*—McDermott, Will & Emery

(57) ABSTRACT

The present invention provide an adhesive sheet for electrostatic chucking device having high heat resistance and to an electrostatic chucking device which causes little curvature of the ceramic board after application of heat and is excellent in heat resistance and adsorptity. The adhesive sheet of the present invention comprises a silicone resin elastic layer 11 and thermosetting adhesive layers 12 and 13 which are each laminated on the silicone resin elastic layer, wherein said thermosetting adhesive layers are composed of epoxy resin or phenol resin. The electrostatic chucking device of the present invention is produced by laminating an electrode and a ceramic layer having an adsorptive surface on a metal base in this order via the adhesive sheet of the present invention.

8 Claims, 1 Drawing Sheet

ADHESIVE SHEET AND ELECTROSTATIC CHUCKING DEVICE

BACKGROUND OF THE INVENTION

1. Field of the Invention

The present invention relates to an adhesive sheet for production of an electrostatic chucking device having an adsorptive surface composed of ceramic and to an electrostatic chucking device produced using the adhesive sheet.

2. Description of Related Art

In the industry of producing IC tips, a semiconductor wafer is fixed to an etching equipment using a chucking device, which is then subjected to an etching treatment in a vacuum to produce IC tips. As for the mechanism of the chucking device, there are mechanical type, vacuum type and electrostatic type. Among them, the electrostatic chucking device is used widely because of having advantages that it can be used in vacuum, it sufficiently holds the wafer even if some curvatures are in the wafer, and it can easily handled.

For example, Japanese Patent Application Laid-open No. 347352/1993 discloses an electrostatic chucking device of the following structure. Namely, an insulating film is laminated on a metal base, and an insulation maintenance board made of ceramic is laminated on the upper surface of the insulating film. An electric conduction film for electrostatic adsorption consisting of copper foil is formed on the under surface of the insulation maintenance board, and a wafer is laid on the upper surface of the insulation maintenance board. The insulating film is composed of polyimide adhesive layers laminated each on both sides of an insulating polyimide film substrate. Use of this insulating film secures electric insulation between the electric conduction film for electrostatic adsorption and the metal base. Adsorptity can be raised by making thin the insulation maintenance board made of ceramic. However, when the insulation maintenance board was made thin in this electrostatic chucking device, curvature of the adsorptive surface came to actualize by application of heat to the electrostatic chucking device. As the result, there became problems that not only the adsorptity for the wafer reduced but also the wafer became unable to cool enough.

Moreover, since the plasma processing temperature at the time of wafer processing becomes high in connection with the recent development of large-sized semiconductor wafers and the improvement in production efficiency, it becomes the subject of pressing need to solve the problem of the curvature of the insulation maintenance board made of ceramic, and, in addition, high heat resistance has come to be required for the electrostatic chucking device.

In order to improve the curvature of the adsorptive surface, the present inventors have proposed to provide an electric insulation elastic layer containing a rubber component and a phenolic antioxidant for the electrostatic chucking device (Japanese Patent Application Laid-open No. 215994/1999). The heat resistance of this electric insulation elastic layer however does not withstand the plasma processing temperature, which became higher. It was thus required for a heat-resistant improvement.

SUMMARY OF THE INVENTION

The present invention has been made in view of the above-mentioned circumstances, and the purpose of it is to solve the above-mentioned problems in the prior electrostatic chucking devices having an adsorptive surface made of ceramic. That is, an object of the present invention is to provide an adhesive sheet for electrostatic chucking device which has particularly high heat resistance. Another object is to provide an electrostatic chucking device using said adhesive sheet, which does not cause the curvature of the adsorptive surface.

The adhesive sheet according to the present invention for electrostatic chucking device, which is used for producing the electrostatic chucking device having an adsorptive surface made of ceramics, is characterized by comprising a silicone resin elastic layer and two thermosetting adhesive layers containing an epoxy resin or a phenol resin, each of which is laminated on both sides of said silicone resin elastic layer.

The electrostatic chucking device according to the present invention has an adsorptive surface made of ceramic, which is characterized by that an electrode layer and a ceramic layer having an adsorptive surface are laminated in this order on a metal base via the above-mentioned adhesive sheet, wherein two thermosetting adhesive layers containing an epoxy resin or a phenol resin, each of which is laminated on both sides of said silicone resin elastic layer.

In the adhesive sheet for electrostatic chucking device according to the present invention, it is preferable that the above-mentioned silicone resin elastic layer contains a filler and that a dynamic modulus in 0–125° C. of said silicone resin elastic layer is in a range of 0.1 MPa–30 MPa.

Moreover, as for the above-mentioned thermosetting adhesive layer, it is preferable to contain at least one selected from the group consisting of polyamide resin, acrylonitrile-butadiene copolymer, polyester resin and polyimide resin, as an elastic component.

It is particularly preferable that the polyimide resin is composed of a structural unit represented by the following formula (1) and a structural unit represented by the following formula (2).

(1)

(2)

wherein W is a direct bond, an alkylene group having 1–4 carbon atoms, —O—, —SO$_2$— or —CO—, Ar is a divalent aromatic group having 1–4 aromatic rings, $R^1$ and $R^6$ are each an alkylene group having 1–4 carbon atoms or a group represented by the following formula (3):

(3)

wherein Alk is an alkylene group having 1–4 carbon atoms which bonds to the silicone atom, $R^2$–$R^5$ are each an alkyl group having 1–4 carbon atoms, and n is an integer of 0–32.

BRIEF DESCRIPTION OF THE DRAWINGS

Symbols in the drawings are as follows. 10:adhesive sheet, 11:silicone resin elastic layer, 12 and 13:thermosetting adhesive layer, 21:metal base, 22:insulating film, 23:electrode layer, 24:adhesive layer, 25:ceramic board, 31:metal base, 32:insulating film, 32a:polyimide film, 32b and 32c:polyimide adhesive, 33:insulation maintenance board, 34: electric conduction film for electrostatic adsorption.

DETAILED DESCRIPTION OF THE PREFERRED EMBODIMENTS

Figure 1:
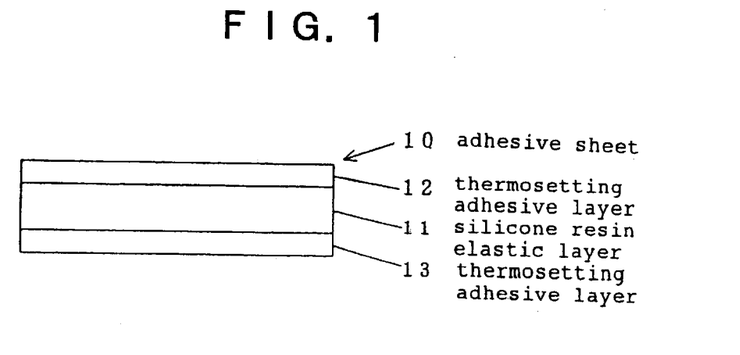
FIG. 1 is a schematic sectional view of the adhesive sheet according to the present invention.

First, the adhesive sheet for electrostatic chucking device of the present invention will be illustrated with reference to FIG. 1. The adhesive sheet 10 for electrostatic chucking device according to the present invention has a structure that the thermosetting adhesive layers 12 and 13 are each laminated on both sides of the silicone resin elastic layer 11.

The silicone resin elastic layer is made by molding a silicone resin in a sheet having a thickness of 10–500 μm and, preferably, 20–200 μm.

As the silicone resin, crosslinked materials of millable type silicone and liquid silicone can be used. The main raw material for the millable type silicone is a straight chain polysiloxane having a high degree of polymerization of the molecular weight: 100,000–3,000,000, which can be subject to radical type or addition type crosslinking reaction. As the silicone, there may be used dimethyl type, methylvinyl type, methylphenyl type, fluorosilicone type and the like. The liquid silicone is classified into addition type and condensation type. The addition type silicone can be obtained by an addition reaction of, for example, an organopolysiloxane having vinyl groups with an organopolysiloxane having Si—H bonds. The condensation type silicone can be obtained by a condensation reaction of, for example, silanol with Si-X (crosslinking agent).

As for the above-mentioned silicone resin elastic layer, it is desirable to add filler to the above-mentioned silicone resin. Examples of the filler to be preferably used include silica, calcium carbonate, quartz powder, titanium oxide, iron oxide, etc. The amount of the filler is preferably in a range of 0.1–50% by weight, because the adhesive property of it to the thermosetting adhesive layers on both sides is improved.

The above-mentioned silicone resin elastic layer is preferable to be subjected to surface treatment such as by corona, plasma, etc. or treatment with a silicone rubber primer. By carrying out these treatments, the adhesive property to the thermosetting adhesive layers becomes improved at the time of heating under high humidity.

In the present invention, the silicone resin elastic layer is preferable to have a dynamic modulus in 0–125° C. of 0.1 MPa–30 MPa, and more preferably 1 MPa–30 MPa. When the dynamic modulus is in a range of 0.1 MPa–30 MPa, stress relaxation becomes suitable.

The dynamic modulus is the value measured by a dynamic modulus measuring instrument (Orientek Co.: Rheovibron DDV-01FP) under conditions of 11 Hz and a load of 5 g at a temperature raising rate of 3° C./min in the air. As the sample for measurement, a sheet with a thickness of 20–500 micrometers, a length of 10–40 mm, and a width of 5 mm is used.

Next, the thermosetting adhesive layers containing an epoxy resin or a phenol resin provided on the both sides of the above-mentioned silicone resin elastic layer are composed of a curable component and an elastic component. In the present invention, it is preferred that the thermosetting adhesive layer contains, as the curable component, epoxy resin or phenol resin and, as the elastic component, at least one selected from the group consisting of polyamide resin, acrylonitrile-butadiene copolymer, polyester resin and polyimide resin. It is particularly preferable to contain the below-mentioned polyimide resin as the elastic component. These thermosetting adhesive layers have each a thickness of 3–80 μm, preferably 5–50 μm, and more preferably 7–30 μm. These thermosetting adhesive layers may be the same or different each other.

In the present invention, examples of the epoxy resin used as the curable component include difunctional and polyfunctional epoxy resins such as bisphenol type, phenol novolak type, cresol novolak type, glycidyl ether type, glycidyl ester type, glycidyl amine type, trihydroxyphenylmethane type, tetraglycidyl phenolalkane type, naphthalene type, diglycidylphenylmethane type, diglycidyl biphenyl type, etc. Of them, bisphenol type epoxy resin is desirable and bisphenol A type epoxy resin is more preferable. Two or more of these epoxy resins may be used together.

The above-mentioned epoxy resins are preferred to have an epoxy equivalent (g/eq.) of 120–2500 and more preferably 150–1000.

Examples of the phenol resin include novolak phenol resins such as alkylphenol resin, p-phenylphenol resin, bisphenol A type phenol resin, etc. and other known phenol resins such as resol phenol resin, polyphenyl-p-phenol resin, etc. Especially, novolak phenol resin is used preferably.

A blending rate of the curable component to the elastic component in the case of the curable component being epoxy resin is in a range of 5–300 parts by weight, preferably 10–150 parts by weight and more preferably 20–100 parts by weight based on 100 parts by weight of the elastic component. If the amount of the epoxy resin is less than 5 parts by weight, the heat resistance reduces. If it is higher than 300 parts by weight, flexibility of the adhesive after hardening is lost. In the case of the curable component being phenol resin, the blending rate of the curable component is in a range of 5–150 parts by weight, preferably 5–100 parts by weight and more preferably 10–100 parts by weight based on 100 parts by weight of the elastic component.

In the above-mentioned thermosetting adhesive layer, other curable components such as maleimide compounds, etc. can also be further used.

In case of using the epoxy resin, the thermosetting adhesive layer may contain a hardening agent and a hardening accelerator for epoxy resin, if necessary. Examples of them include imidazoles, tertiary amines, phenols, dicyandiamides, aromatic diamines, organic peroxides, etc.

Regarding the elastic component, polyamide resins prepared from a dimmer acid and a diamine can be used. Particularly, polyamide having a weight average molecular weight of 1,000–200,000, and preferably 2,000–100,000 which is obtained from a dimmer acid obtained from an unsaturated aliphatic acid having 18 carbon atoms and an aliphatic diamine such as ethylene diamine, butylene diamine, hexamethylene diamine, etc. can be preferably used. The polyamide resin is preferred to have an amine value of 1–60 (mg KOH/g) and more preferably 3–50. The amine value and the weight average molecular weight are set so as to be in a desired range depending on the formulation of the above-mentioned curable component and the characteristic of the above-mentioned silicone resin elastic layer.

The amine value is measured by a method that a solution prepared by dissolving 1 g of polyamide resin in toluene/n-butanol (1/1) is titrated using a 0.1% methanol solution of bromocresol as an indicator and 0.1N hydrochloric acid as a titrant, and the value is shown as mg of an equivalent amount of potassium hydroxide.

As the acrylonitrile-butadiene copolymer, those well-known can be used, and those having a weight average molecular weight of 10,000–10,000,000 and an acrylonitrile amount of 5–60% by weight are preferably used. Of them, those which are prepared by modifying the acrylonitrile-butadiene copolymer with amino group, carboxyl group, vinyl group or epoxy group are particularly preferable, because of having improved compatibility with the above-mentioned curable component and having excellent plasticity.

Examples of the polyester resin which is a polymer elastic component containing ester bonds include Byron 200 and 300 series (produced by Toyobo Co., Ltd.) etc. The weight average molecular weight thereof is preferred to be in a range of 10,000–3,000,000 and preferably 100,000–1,000,000.

The polyimide resin composed of a structural unit represented by the above-mentioned formula (1) and a structural unit represented by the above-mentioned formula (2) is preferably used in the present invention. Polyimide resin in which Ar in the above-mentioned formula (2) is the structure shown in the following formulas is particularly preferable to use.

wherein $R^7$, $R^8$, $R^9$, and $R^{10}$ which may be identical or different represent each a hydrogen atom, an alkyl group having 1–4 carbon atoms or an alkoxy group, but all of them are not hydrogen atoms simultaneously.

In the above-mentioned polyimide resin, it is preferable that the molar ratio of the structural unit represented by the formula (1) and the structural unit represented by the formula (2) is in a range of 1:99–90:10 and preferably 5:95–50:50. The above-mentioned polyimide resin in the present invention is preferred to have a number average molecular weight of 5,000–500,000 and more preferably 5,000–100,000. In the specification, the number average molecular weight is a value that was measured by gel permeation chromatography (GPC) and based on polystyrene as a standard.

In the present invention, the above-mentioned polyimide resin may be reactive polyimide resin. That is, the reactive polyimide resin may have a structural unit represented by the following formula (2-1) and a structural unit represented by the following formula (2—2) as the above-mentioned structural unit (2). When this reactive polyimide resin is used as at least one component of the polyimide resin, a more uniform adhesive layer having good plasticity can be obtained, and the heat resistance also becomes good.

(2-1)

(2-2)

(4)

(5)

wherein W has the same meaning as the above mentioned definition, $Ar^1$ is a divalent aromatic group having 1–4 aromatic rings which have no hydroxyl group or carboxyl group, and $Ar^2$ is a divalent aromatic group having 1–4 aromatic rings which have one or two hydroxyl groups or carboxyl groups.

In the above-mentioned reactive polyimide resin, it is particularly preferable that the molar ratio of the structural unit represented by the formula (1) and the structural unit represented by the formulas (2-1) and (2—2) is in a range of 5:95–50:50, and that the molar ratio of the structural unit represented by the formula (2-1 ) and the structural unit represented by the formula (2—2) is in a range of 1:99–99:1 and particularly 5:95–95:5.

Furthermore, when the polyimide resin is used as the elastic component in the thermosetting adhesive layer in the present invention, it is particularly preferable that the elastic component comprises 2 or more sorts of polyimide resin, at least one of which is reactive polyimide resin composed of a structural unit represented by the formula (1), a structural formula represented by the formula (2-1) and a structural unit represented by the formula (2—2), and the other is polyimide resin composed of a structural unit represented by the formula (1) and a structural formula represented by the formula (2-1). When two or more sorts of polyimide resin are used, more uniform adhesive layer having excellent plasticity can be obtained, and the heat resistance also becomes good.

In the above-mentioned case, it is preferable that glass transition temperature (Tg) of the reactive polyimide resin is different from that of the other polyimide resins. Difference of 20° C. or more of the glass transition temperature is more preferable, because adhesion temperature can be lowered. The glass transition temperature is a value measured by Rheovibron (Model: DDV-01/25FP) of Orientek Co. The measurement was carried out using a sample having length x width of 5×0.2 cm, the thickness of about 50 μm under conditions at a temperature of 25–300° C., and temperature raising rate of 3° C./minute, by applying synthetic wave of 110 Hz, and the value was shown as the maximum of tan δ.

As for the blending rate of two sorts of polyimide resin which have each a different glass transition temperature, it is preferable that the polyimide resin having a higher Tg is in a range of 25–400 parts by weight based on 100 parts by weight part of the polyimide resin having a lower Tg. Moreover, it is preferable that the above-mentioned reactive polyimide resin is incorporated in an amount of 10% by weight or more, preferably in an amount 15–85% and more preferably in an amount of 25 to 75% by weight, based on the whole polyimide resins.

The above-mentioned polyimide resin used in this invention can be prepared by polycondensating, for example, a tetracarboxylic acid dianhydride represented by the following formula (4) with a siloxane compound having amino groups on both ends represented by the following formula (5) and a diamine compound represented by the following formula (6), followed by carrying out imidation of the resultant polyamic acid by ring closure.

wherein W, Ar, $R^1$–$R^6$, and n have the same meanings as described above.

When a diamine compound of the following formula (6-1) and a diamine compound of the following formula (6-2) are used simultaneously as the diamine compound represented by the formula (6), the polyimide resin composed of structural units represented by the above-mentioned formulas (2-1) and (2—2) can be prepared.

$$H_2N-Ar^1-NH_2 \quad (6\text{-}1)$$

$$H_2N-Ar^2-NH_2 \quad (6\text{-}2)$$

wherein $Ar^1$ and $Ar^2$ have the same meanings as described above.

In the following, raw materials used for production of the above-mentioned polyimide resin according to the present invention will be illustrated. Examples of the tetracarboxylic acid dianhydride represented by the above-mentioned formula (4) include 2,3,3',4'-biphenyltetracarboxylic acid dianhydride, 3,4,3',4'-biphenyltetracarboxylic acid dianhydride, 2,3,2',3'-biphenyltetracarboxylic acid dianhydride, bis(3,4-dicarboxyphenyl)methane dianhydride, bis(3,4-dicarboxyphenyl)ether dianhydride, bis(3,4-dicarboxyphenyl)sulfone dianhydride, 2,2-bis(3,4-dicarboxyphenyl)propane dianhydride, 3,4,3',4'-benzophenonetetracarboxylic acid dianhydride, 4,4'-biphthalic acid dianhydride, etc.

Examples of the siloxane compound having amino groups in both ends represented by the above-mentioned formula (5) include 1,3-bis(3-aminopropyl)-1,1,3,3-tetramethyldisiloxane, α, ω-bis(3-aminopropyl)polydimethylsiloxane (for example, tetramer and octamer of dimethylsiloxane having terminal aminopropyl groups), 1,3-bis(3-aminophenoxymethyl)-1,1,3,3-tetramethyldisiloxane, α, ω-bis(3-aminophenoxymethyl)polydimethylsiloxane, 1,3-bis[2-(3-aminophenoxy)ethyl]-1,1,3,3-tetramethyldisiloxane, α, ω-bis[2-(3-aminophenoxy)ethyl]polydimethylsiloxane, 1,3-bis[3-(3-aminophenoxy)propyl]-1,1,3,3-tetramethyldisiloxane, α,ω-bis[3-(3-aminophenoxy)propyl]polydimethylsiloxane, etc. In the above-mentioned siloxane compounds, the polysiloxanes have an average degree of 2–31 and preferably 2–16.

Examples of the diamine compound represented by the above-mentioned formula (6-1) as the diamine compounds shown by the above-mentioned formula (6) include 3,3'-diaminodiphenyl methane, 3,4'-diaminodiphenyl methane, 4, 4'-diaminodiphenyl methane, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 3,3'-bis(3-aminophenoxy)diphenyl ether, 3,31-bis(4-aminophenoxy)diphenyl ether, 3,4'-bis(3-aminophenoxy)

diphenyl ether, 3,4'-bis(4-aminophenoxy)diphenyl ether, 4,4'-bis(3-aminophenoxy)diphenyl ether, 4,41-bis(4-aminophenoxy)diphenyl ether, 3,3'-bis(3-aminophenoxy)biphenyl, 3,3'-bis(4-aminophenoxy)biphenyl, 3,4'-bis(3-aminophenoxy)biphenyl, 3,4'-bis(4-aminophenoxy)biphenyl, 4,4'-bis(3-aminophenoxy)biphenyl, 4,4'-bis(4-aminophenoxy)biphenyl, bis[4-(3-aminophenoxy)phenyl]sulfone, bis[4-(4-aminophenoxy)phenyl]sulfone, 2,2-bis[3-(3-aminophenoxy)phenyl]propane, 2,2-bis [3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis [4-(3-aminophenoxy)phenyl]hexafluoropropane, 2,2-bis[4-(4-aminophenoxy)phenyl]hexafluoropropane, 9,9-bis(3-aminophenyl)fluorene, 9,9-bis(4-aminophenyl)fluorene, 3,3-diamino-2,2',4,4'-tetramethyldiphenylmethane, 3,3'-diamino-2,2',4,4'-tetraethyldiphenylmethane, 3,3'-diamino-2,2',4,4'-tetrapropyldiphenylmethane, 3,3'-diamino-2,2',4,4'-tetraisopropyldiphenylmethane, 3,3'-diamino-2,2',4,4'-tetrabutyldiphenylmethane, 3,4'-diamino-2,3',4,5'-tetramethyldiphenylmethane, 3,4'-diamino-2,3',4,5'-tetraethyldiphenylmethane, 3,4'-diamino-2,3',4,5'-tetrapropyldiphenylmethane, 3,4'-diamino-2,3',4,5'-tetraisopropyldiphenylmethane, 3,4'-diamino-2,3',4,5'-tetrabutyldiphenylmethane, 4,4'-diamino-3,3',5,5'-tetramethyldiphenylmethane, 4,4'-diamino-3,3',5,5'-tetraethyldiphenylmethane, 4,4'-diamino-3,3',5,5'-tetrapropyldiphenylmethane, 4,4'-diamino-3,3',5,5'-tetraisopropyldiphenylmethane, 4,4-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetrapropoxydiphenylmethane, 4,4'-diamino-3,3',5,5'-tetraisopropoxydiphenylmethane, 4,4'-diamino-3,3',5,5'-tetrabutoxydiphenylmethane, 4,4'-diamino-3,3',5,5'-dimethoxydiphenylmethane, 4,4'-diamino-3,3'-diethoxydiphenylmethane, 4,4'-diaminodiphenyl, 3,4'-diaminodiphenyl ether, 4,4'-diaminodiphenyl ether, 4,4'-diaminobenzophenone, 4,4'-diaminodiphenyl sulfone, 3,3'-diaminodiphenhyl sulfone, 2,2'-bis(4-amionophenyl)propane, etc. Two or more of these diamine compounds may be used together.

Examples of the diamine compound represented by the formula (6-2) include 2,5-dihydroxy-p-phenylenediamine, 3,3'-dihydroxy-4,4'-diaminodiphenyl ether, 4,31-dihydroxy-3,4'-diaminodiphenyl ether, 3,3'-dihydroxy-4,4,-diaminobenzophenone, 3,3'-dihydroxy-4,4'-diaminodiphenylmethane, 3,3'-dihydroxy-4,4'-diaminodiphenyl sulfone, 4,4'-dihydroxy-3,3'-diaminodiphenyl sulfone, 2,2'-bis[3-hydroxy-4-(4-aminophenoxy)phenyl]propane, bis[3-hydroxy-4-(4-aminophenoxy)phenyl]methane, 3,3'-dicarboxy-4,4'-diaminodiphenyl ether, 4,3'-dicarboxy-3,4'-diaminodiphenyl ether, 3,3'-dicarboxy-4,41'-diaminobenzophenone, 3,3'-dicarboxy-4,4'-diaminodiphenylmethane, 3,3'-dicarboxy-4,4'-diaminodiphenyl sulfone, 4,4'-dicarboxy-3,3'-diaminodiphenyl sulfone, 2,2'-bis[3-carboxy-4-(4-aminophenoxy)phenyl]propane, bis[3-carboxy-4-(4-aminophenoxy)phenyl]methane, etc. Two or more of these diamine compounds may be used together.

In the following, the condensation reaction of the above-mentioned raw materials will be illustrated in detail. The polyimide resin can be prepared by reacting the above-mentioned tetracarboxylic acid dianhydride with the siloxane compound having amino groups in both ends and the diamine compound in the presence of a solvent at a temperature of −20–150° C., preferably 0–60° C. for several ten minutes-several days, followed by imidation of the resultant polyamic acid.

Examples of the solvent include amide type solvent such as N,N-dimethylformamide, N,N-dimethylacetamide, N,N-diethylacetamide, N-methyl-2-pyrrolidone, etc., sulfur containing solvent such as dimethylsulfoxide, dimethylsulfone, etc., phenol type solvent such as phenol, cresol, xylenol, etc., acetone, tetrahydrofuran, pyridine, tetramethyl urea and the like.

Imidation of the above-mentioned polyamic acid can be carried out by a process of ring-closing by dehydration with heat or by a process of chemically ring-closing using a dehydration-ring closure catalyst. In case of the process of ring-closing by dehydration with heat, the reaction temperature is in a range of 150–400° C., preferably 180–350° C., and the reaction time is several ten minutes-several days, preferably 2 hours-12 hours. Examples of the dehydration-ring closure catalyst used in the process of chemically ring-closing include acid anhydrides of acetic acid, propionic acid, butyric acid, benzoic acid, etc. In order to accelerate the ring closure reaction, it is desirable to use it together with pyridine, etc. The amount of these catalysts is 200% by mol or more and preferably 300–1000% by mol based on the whole amount of diamines.

The above-mentioned thermosetting adhesive layer may contain organic and/or inorganic filler in the present invention. For example, alumina, silicon nitride, boron nitride, etc. can be incorporated for the purposes of giving insulation and thermal conductivity. Metal powder, such as silver, copper, nickel, etc. can be used for the purposes of giving thermal conductivity. Titanium oxide, calcium carbonate, silica, zinc oxide, magnesium oxide, etc. can be incorporated for the purpose of controlling dielectric properties, thermal expansion, elasticoviscosity and tackiness. A preferable amount of the filler is in a range of 1–70% by weight, and preferably 5–50% by weight, based on the whole solid content of the adhesive resin. A preferable average particle size of the filler is in a range of 0.01–5 μm, and preferably 0.05–1 μm.

The adhesive sheet for electrostatic chucking device of the present invention can be produced as follows, for example. That is, a coating of an adhesive composition which is prepared by dissolving/dispersing the above-mentioned components in the above-mentioned solvent is applied to a release film, following by drying with heat to form a thermosetting adhesive layer in a semi-cured state. It is then laminated on one side of a silicone resin elastic layer which is molded in sheet. After the laminate was allowed to adhesion with pressure, a thermosetting adhesive layer which is the same as described above is laminated on the other side of the silicone resin elastic layer and allowed to adhesion with pressure. The release films are then removed to obtain an adhesive sheet of the present invention.

Next, the electrostatic chucking device according to the present invention is illustrated.

Any metal base can be used for the electrostatic chucking device of the present invention if it is made of the material which is not invaded by plasma. For example, an aluminum base the surface of which is subjected to surface treatment by flame spraying of ceramic, alumite processing, etc. can be suitably used. The metal base is preferred, if necessary, to be processed so as to have a temperature controlling means for running water, etc., openings for passing cold gas for cooling the wafer, and a means for applying electric pressure to the electrode.

On the metal base, an electrode layer and a ceramic layer which provide an adsorptive face are laminated in this order via the above-mentioned adhesive sheet of the present invention. As the ceramic layer for providing an adsorptive face, ceramic thin board of alumina, silicon nitride, silicon carbide, aluminum nitride, etc. can be preferably used. The ceramic thin board is preferred to have a thickness of 0.05–1.0 mm and preferably 0.1–0.5 mm. If the thickness is less than 0.05 mm, the thin board is easily broken at the time of laminating by pressure, and if thicker than 1.0 mm, electrostatic adsorptity reduces.

The electrode layer is provided between the thermosetting adhesive layer of the upper side in the above-mentioned adhesive sheet and the ceramic layer having the adsorptive face. Any electrical conductive material may be used for forming the electrode layer, if it generates adsorptity when electric pressure is impressed. As the electrically conductive material, thin film of metal is preferred. Examples of it include metal thin film formed by vacuum evaporation, plating, sputtering, etc., metal foil such as copper foil, thin layer formed with an electrically conductive paste, and the like. Examples of the metal used for such thin layers include copper, aluminum, gold, silver, platinum, chromium, nickel, tungsten, etc. The metal thin film formed by vacuum evaporation, plating, or sputtering, and metal foil such as copper foil, etc. are particularly preferred to use.

The electrode layer is classified into the following three laminate forms. Namely, (1) Form which is obtained by laminating a copper foil on the non-adsorptive face of the ceramic layer via an adhesive layer, and then laminating it on the above-mentioned adhesive sheet so as to face the copper foil to the thermosetting adhesive layer.

(2) Form which is obtained by forming directly the electrode layer on the ceramic layer by vacuum evaporation, sputtering, or plating, and then laminating it on the above-mentioned adhesive sheet so as to face the electrode layer to the thermosetting adhesive layer.

(3) Form which is obtained by forming an electrode layer on a surface of an insulating film by vacuum evaporation, sputtering, or plating, forming then a desired electrode pattern by exposure to light-etching-washing to produce an electrode sheet, laminating a ceramic thin board on the electrode layer of the resultant electrode sheet via an adhesive layer, and then laminating the thermosetting adhesive layer of the above-mentioned adhesive sheet on the insulating face of the insulating film.

Of these, the laminate form of (3) is preferable because it is possible to produce plural electrode layers simultaneously, to narrow insulated width of the circumference and to raise adsorptity.

Figure 2:
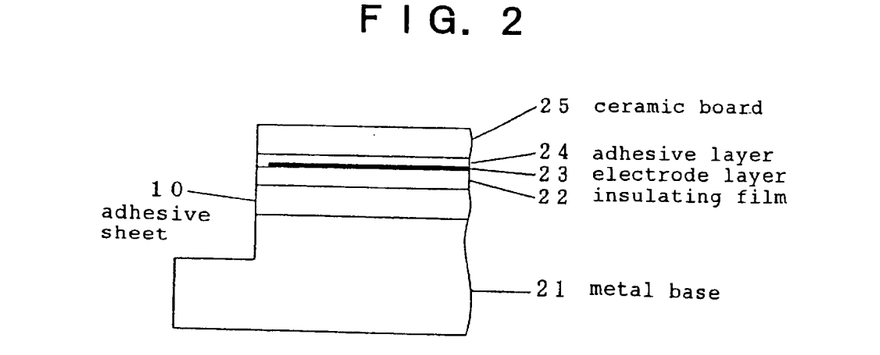
FIG. 2 is a schematic sectional view of an example of the electrostatic chucking device according to the present invention.
Figure 3:
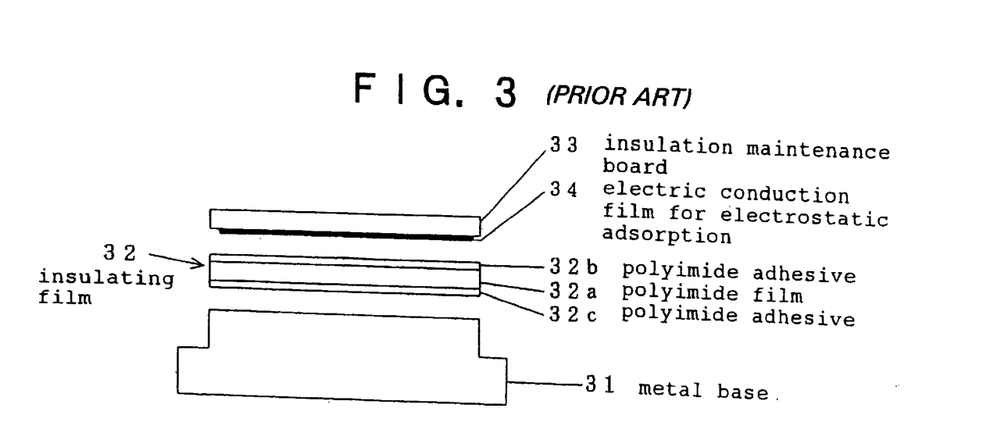
FIG. 3 is an exploded schematic view of an example of the prior electrostatic chucking device.

FIG. 2 shows the sectional view of the electrostatic chucking device of the present invention that has an electrode layer of the laminate form of above-mentioned (3). In FIG. 2, the electrostatic chucking device according to the present invention has the construction that an adhesive sheet 10 of the present invention wherein the thermosetting adhesive layers were laminated on both sides of a silicone resin elastic layer is laminated on a metal base 21. On the upper side of the adhesive sheet an insulating film 22 having an electrode layer 23 formed by plating, etc. is laminated. On the electrode layer 23 formed on the upper side of the insulating film, a ceramic board 25 is laminated via an adhesive layer 24. A wafer is put on the upper face which is the adsorptive face of the ceramic board.

Upon production of the electrostatic chucking device, the adhesive layer is hardened, if necessary. Moreover, a release film may be provided on the adhesive layer of the adhesive sheet of the present invention in order to avoid that the surface for sticking with the metal base of the adhesive layer in the adhesive sheet is exposed.

As the above-mentioned insulating film on which the electrode layer is formed, films of polyimide, polyamide imide, polyolefin, polyparabanic acid, polyester, etc. can be used, and polyimide film is particularly preferred because of being excellent in insulation and plasma-proof property. A preferable thickness of the insulating film is in a range of 10–100 $\mu$m, and more preferably 25–75 $\mu$m. If the thickness is less than 10 $\mu$m, handling is difficult. If it exceeds 100 $\mu$m, thermal conductivity deteriorates. Thermosetting resins and heat-resisting thermoplastic resins can be use for the adhesive layers for bonding the ceramic layer to the copper foil in the above-mentioned laminate form (1) and for bonding the electrode layer of the electrode sheet to the ceramic layer in the above-mentioned laminate form (3). Examples of them include polyester resin, polyurethane resin, polyimide resin, epoxy resin phenol resin, polyamide resin, acrylonitrile-butadiene copolymer, etc., which can be used solely or as a mixture.

EXAMPLE

Hereafter, the present invention will be illustrated in detail based on examples.

Synthetic Example 1

<Polyimide resin (A) composed of structural units of the formulas (1) and (2-1) >

In a flask equipped with a stirrer, 10.33 g (52 mmol) of 3,4'-diaminodiphenyl ether, 18.23 g (48 mmol) of 1,3-bis (3-aminophenoxymethyl)-1,1,3,3-tetramethyldisiloxane, 32.22 g (10 mmol) of 3,4,3',4'-benzophenonetetracarboxylic acid dianhydride and 300 ml of N-methyl-2-pyrrolidone (refers to as "NMP" hereinafter) were introduced under iced temperature, followed by stirring for 1 hour. The resultant solution was then allowed to react under nitrogen atmosphere at room temperature for 3 hours to synthesize polyamic acid. 50 ml of toluene and 1.0 g of p-toluenesulfonic acid were added to the resultant solution of polyamic acid, followed by heating to 160° C. Imidation reaction was performed for 3 hours with separating the water which was azeotropically distilled with toluene. After toluene was distilled off, the resultant polyimide varnish was poured into methanol. The resultant precipitate was separated and subjected to crushing, washing and drying to obtain 54.3 g (yield: 95%) of a polyimide. When infrared absorption spectra of this polyimide were measured, absorption of imide was observed in 1718 and 1783 cm$^{-1}$. Molecular weight, glass transition temperature, and temperature of starting heat decomposition were measured too. Those results are shown in Table 1.

Synthetic Example 2

<Reactive polyimide resin (a) composed of structural units of the formulas (1), (2-1) and (2—2)>

Using 16.10 g (39 mmol) of 2,2-bis[4-(4-aminophenoxy) phenyl]propane, 1.25 g (5 mmol) of 3,3'-dicarboxy-4,4'-diaminodiphenylmethane, 21.25 g (56 mmol) of 1,3-bis(3-aminophenoxymethyl)-1,1,3,3-tetramethyldisiloxane, 32.22 g (100 mmol) of 3,4,3',4'-benzophenonetetracarboxylic acid dianhydride and 300 ml of NMP, a reactive polyimide was obtained in an amount of 62.5 g (yield: 93%) by the same method as the Synthetic Example 1. When infrared absorption spectra of this polyimide were measured, absorption of imide was observed in 1718 and 1783 cm$^{-1}$. Molecular weight, glass transition temperature, and temperature of starting heat decomposition were measured too. Those results are shown in Table 1.

Synthetic Example 3

<Reactive polyimide resin (b) composed of structural units of the formulas (1), (2-1) and (2—2)>

Using 30.38 g (74 mmol) of 2,2-bis[4-(4-aminophenoxy) phenyl]propane, 2.35 g (8 mmol) of 3,3'-dicarboxy-4,4'-diaminodiphenylmethane, 13.84 g (18 mmol) of dimethylsiloxane octamer terminated with aminopropyl terminal groups, 29.42 g (100 mmol) of 2,3,3',4'-biphenyltetracarboxylic acid dianhydride and 300 ml of NMP, a reactive polyimide was obtained in an amount of 67.8 g (yield: 94%) by the same method as the Synthetic Example 1. When infrared absorption spectra of this polyimide were measured, absorption of imide was observed in 1718 and 1783 cm$^{-1}$. Molecular weight, glass transition temperature, and temperature of starting heat decomposition were measured too. Those results are shown in Table 1.

Synthetic Example 4

<Reactive polyimide resin (c) composed of structural units of the formulas (1), (2-1) and (2—2)>

Using 30.38 g (74 mmol) of 2,2-bis[4-(4-aminophenoxy) phenyl]propane, 1.12 g (4 mmol) of 3,3'-dicarboxy-4,4'-diaminodiphenylmethane, 16.85 g (22 mmol) of dimethylsiloxane octamer having aminopropyl terminal groups, 35.83 g (10 mmol) of bis(3,4-dicarboxyphenyl)sulfone dianhydride and 300 ml of NMP, a reactive polyimide was obtained in an amount of 75.0 g (yield: 93%) by the same method as the Synthetic Example 1. When infrared absorption spectra of this polyimide were measured, absorption of imide was observed in 1718 and 1783 cm$^{-1}$. Molecular weight, glass transition temperature, and temperature of starting heat decomposition were measured too. Those results are shown in Table 1.

TABLE 1

| Polyimide | Epoxy reactive group | Number average molecular weight | Glass transition temperature (° C.) | Temperature of starting heat decomposition (° C.) |
|---|---|---|---|---|
| Syn. Ex. 1 (A) | Nothing | 27000 | 185 | 420 |
| Syn. Ex. 2 (a) | Exist | 18000 | 160 | 421 |
| Syn. Ex. 3 (b) | Exist | 25000 | 80 | 425 |
| Syn. Ex. 4 (c) | Exist | 21000 | 50 | 420 |

(Preparation of adhesive composition Ad-1)

25 parts by weight of polyimide resin (A), 25 parts by weight of reactive polyimide resin (a), 25 parts by weight of bisphenol A type epoxy resin (Epicote 1001, produced by Yuka Shell Epoxy Co.), 25 parts by weight of p-t-butylphenol resin (CKM2432, produced by Showa High Polymer Co.) and 0.1 parts by weight of 2-ethyl-4-methylimidazole were dissolved in tetrahydrofuran (referred to as "THF" hereinafter) to prepare adhesive composition Ad-1 having a solid content of 40% by weight.

(Preparation of adhesive composition Ad-2)

Adhesive composition Ad-2 was prepared by the same manner as the case of above-mentioned adhesive composition Ad-1 except that reactive polyimide resin (b) was used in place of the reactive polyimide resin (a).

(Preparation of adhesive composition Ad-3)

Adhesive composition Ad-3 was prepared by the same manner as the case of above-mentioned adhesive composition Ad-1 except that reactive polyimide resin (c) was used in place of the reactive polyimide resin (a).

(Preparation of adhesive composition Ad-4)

25 parts by weight of polyimide resin (A), 25 parts by weight of bisphenol A type epoxy resin (Epicote 1001, produced by Yuka Shell Epoxy Co.), 25 parts by weight of p-t-butylphenol resin (CKM2432, produced by Showa High Polymer Co.) and 0.1 parts by weight of 2-ethyl-4-methylimidazole were dissolved in tetrahydrofuran to prepare adhesive composition Ad-4 having a solid content of 40% by weight.

(Preparation of adhesive composition Ad-5)

200 parts by weight of a 25 wt. % solution of polyamide (Macromelt 6900, produced by Henkel Japan Co.) in a solvent mixture of isopropyl alcohol and toluene (1:1), 33 parts by weight of epoxy resin (Epicote 828, produced by Yuka Shell Epoxy Co.), 34 parts by weight of a 50 wt. % solution of phenol resin (Markarinker RM-H2P, produced by Marzen sekiyu Co.) in methyl ethyl ketone (referred to as "MEK" hereinafter), and 10 parts by weight of a 1 wt. % solution of 2-ethyl-4-methylimidazole in MEK were blended to prepare adhesive composition Ad-5.

(Production of the adhesive sheet)

Example 1

To a polyethylene terephthalate film (referred to as "PET film" hereinafter) which was subjected to releasing treatment, was applied a coating prepared by adding to and dispersed in 100 parts by weight of one-liquid addition type silicone resin (TSE3221, produced by Toshiba Silicone Co.) 1.5 parts by weight of a silica filer having an average particle size of 0.08 μm, so as to have a thickness after drying of 50 μm, followed by drying at 150° C. for 10 minutes to form a silicon resin elastic layer.

On the other hand, to a surface of an PET film which was subjected to releasing treatment was applied the above-mentioned adhesive composition Ad-1 so as to have a thickness after drying of 10 am, followed by drying at 130° C. for 5 minutes to form a semi-cured thermosetting adhesive layer. The dynamic modulus in 0–125° C. of the resultant semi-cured thermosetting adhesive sheet was 2–7 MPa.

They were then allowed to adhesion with pressure such that were then allowed to adhesion with pressure such that the silicone resin elastic layer faced to the thermosetting adhesive layer. After the PET film on the silicone resin elastic layer was removed, the same semi-cured thermosetting adhesive layer as described above was laminated on the exposed surface with pressure to form an adhesive sheet of the present invention.

Example 2

A semi-cured thermosetting adhesive layer was formed by the same manner as in Example 1 except that the adhesive composition Ad-2 was used instead of the adhesive composition Ad-1 and dried at 100° C. for 7 minutes.

An adhesive sheet of the present invention was produced by the same manner as in Example 1 using the resultant thermosetting adhesive layer instead of the thermosetting adhesive layer of Example 1.

Example 3

A semi-cured thermosetting adhesive layer was formed by the same manner as in Example 1 except that the adhesive composition Ad-3 was used instead of the adhesive composition Ad-1 and dried at 80° C. for 10 minutes.

An adhesive sheet of the present invention was produced by the same manner as in Example 1 using the resultant thermosetting adhesive layer instead of the thermosetting adhesive layer of Example 1.

Example 4

A semi-cured thermosetting adhesive layer was formed by the same manner as in Example 1 except that the adhesive composition Ad-4 was used instead of the adhesive composition Ad-1.

| | |
|---|---|
| Acrylonitrile-butadiene copolymer (Hycar ATBN, weight average molecular weight: 3600, produced by Ube Industries, Ltd.) | 80 parts by weight |
| Maleimide compound represented by the following formula (7) | 20 parts by weight |
| Lauroyl peroxide (Per Louroyl-L, produced by Nippon Oil & Fats Co.) | 0.1 parts by weight |
| Phenolic antioxidant (Adecastab AO-60, produced by Asahi Denka Kogyo K.K) | 3 parts by weight |

(7)

An adhesive sheet of the present invention was produced by the same manner as in Example 1 using the resultant thermosetting adhesive layer instead of the thermosetting adhesive layer of Example 1.

Example 5

A semi-cured thermosetting adhesive layer was formed by the same manner as in Example 1 except that the adhesive composition Ad-5 was used instead of the adhesive composition Ad-1.

An adhesive sheet of the present invention was produced by the same manner as in Example 1 using the resultant thermosetting adhesive layer instead of the thermosetting adhesive layer of Example 1.

Example 6

An adhesive sheet of the present invention was produced by the same manner as in Example 1 except that a silicone resin elastic layer having a dynamic modulus in 0–125° C. of 5–15 MPa was used.

Comparative Example 1

The adhesive composition Ad-1 was applied to both sides of a 50 μm thick polyimide film (Upilex S, produced by Ube Industries, Ltd.) so as to have a thickness after drying of 10 μm, followed by drying at 130° C. for 5 minutes to produce an adhesive sheet for comparison.

Comparative Example 2

A coating for forming an insulating elastic layer having the following formulation was applied to a releasable surface of a PET film which was subjected to releasing treatment so as to have a thickness after drying of 70 μm, followed by drying at 130° C. for 5 minutes to produce an adhesive sheet for comparison.

The following ingredients were dissolved in tetrahydrofuran to prepare a coating for forming insulating elastic layer having a solid content of 40% by weight.

(1) Evaluation of the adhesive sheet
(Plane value)

After removing the PET film of the adhesive sheets obtained in Examples 1–6 and Comparative Examples 1 and 2, each adhesive sheet was inserted between an alumina board (ceramic board) with diameter: 6 inches×thickness: 0.4 mm, and a flat aluminum plate with diameter: 6 inches× thickness: 30 mm. After allowed to adhesion, the resultant laminate was heated to 120° C. for 2 hours to cure the adhesive layers on both sides of each adhesive sheet.

After allowed to stand for cooling, plane value of the surface of ceramic board was measured by means of a laser-type 3-dimensional size measurement equipment (VM500N, produced by NIKON CORP).

The measurement of the plane value was performed as follows. That is, absolute height was measured at a rate of one point for every cm (the base point was the center of the ceramic board). A standard plane was calculated from the height measured as described above by a least-squares method. The plane value (μm) was obtained as the difference between the maximum value and the minimum value of the measured absolute height to the standard plane. The results are shown in Table 2.

TABLE 2

| | Plane value (μm) |
|---|---|
| Example 1 | 10 |
| Example 2 | 8 |
| Example 3 | 7 |
| Example 4 | 8 |
| Example 5 | 9 |
| Example 6 | 12 |
| Comparative Example 1 | 68 |
| Comparative Example 2 | 19 |

As is clear from Table 2, the ceramic board laminated on the aluminum plate using the adhesive sheets of Examples 1–6 according to the present invention had small plane value and the surface was flat. To the contrary, in case of using the adhesive sheet of Comparative Examples 1, the plane value of the ceramic board was remarkably large. In case of the adhesive sheet of Comparative Examples 2, the plane value of the ceramic board was larger than that of Examples 1–6, though it was relatively small.

Curvature of the ceramic board of Comparative Example 1 was also observed with view.

(Percent Thermogravimetric Reduction)

The adhesive compositions used in Examples 1–5 and Comparative Example 1 and the coating for forming insulating elastic layer used in Comparative Example 2 were each applied to a surface of an PET film which was subjected to releasing treatment, followed by drying to 150° C. for 60 minutes to form a semi-cured adhesive layer having a thickness of 20 μm. After the PET film was removed, the hardened adhesive layer was ground to powder to prepare a sample.

Percent thermogravimetric reduction in 20–300° C. of the resultant sample was measured by a thermogravimetric analyzer (TGA) in nitrogen atmosphere. The results are shown in Table 3. The temperature raising rate was 10C/minute.

TABLE 3

| Ex. No. | Percent thermogravimetric reduction (wt. %) |
|---|---|
| Example 1 | 0.3 |
| Example 2 | 0.4 |
| Example 3 | 0.3 |
| Example 4 | 0.3 |
| Example 5 | 0.4 |
| Comparative Example 1 | 0.3 |
| Comparative Example 2 | 2.5 |

As is clear from Table 3, the percent thermogravimetric reduction up to 300° C. was less than 0.4% by weight in the adhesive compositions of Examples 1–5 and Comparative Example 1, while it was 2% by weight in the adhesive composition of Comparative Example 2.

(2) Production of the electrostatic chucking device

On a 50 μm thick polyimide film (Kapton 200H, Toray Dupont Co.), aluminum was deposited by vacuum evaporation, followed by plating copper to form a 7 μm thick copper layer. A negative photosensitive film was then laminated on the copper layer. Subsequently the copper layer was processed to form an electrode layer having a prescribed shape by procedures of light exposure-development-etching-drying.

On the other hand, the adhesive composition Ad-1 was applied to an PET film which was subjected to releasing treatment, so as to have a thickness after drying of 10 μm, followed by drying to 150° C. for 5 minutes to prepare a laminate sheet having a semi-cured thermosetting adhesive layer.

One of PET films was removed from the adhesive sheet prepared in Example 1, and the above-mentioned polyimide film was bonded to the exposed thermosetting adhesive layer. The above-mentioned laminate sheet having the semi-cured thermosetting adhesive layer was then bonded to the electrode layer on the resultant laminate sheet. After the PET film on the thermosetting adhesive layer of the resultant laminate sheet, an alumina ceramic board having a thickness of 0.3 mm and a diameter of 10 inches was bonded to the exposed thermosetting adhesive layer. Subsequently, the other PET film of the adhesive sheet was removed from the resultant laminate, and the exposed thermosetting adhesive layer of the resultant laminate was allowed to adhere to a metal base to produce an electrostatic chucking device A of the present invention.

Electrostatic chucking devices B–F were produced by the same manner as described above expect that the adhesive sheets of Examples 2–6 were used instead of the adhesive layer of Example 1.

Electrostatic chucking devices G and H were produced by the same manner as described above expect that the adhesive sheets of Comparative Examples 1 and 2 were used instead of the adhesive layer of Example 1.

(3) Evaluation of the electrostatic chucking device (Adsorptity)

Adsorptity before application of heat:

The above-mentioned electrostatic chucking devices A–F of the present invention and the electrostatic chucking devices G and H for comparison were each set in a vacuum chamber. After a silicone wafer was mounted on an adsorptive surface of the device, the chamber was controlled to a prescribed degree of vacuum. Predetermined voltage (2 kV) was then applied to the electrodes to electrostatically adsorb the wafer. A fixed amount of helium gas was supplied between the adsorptive surface and the wafer through an opening for introducing gas of the metal base, and the feed pressure (back pressure) of the helium gas was monitored. The feed pressure of 2 minutes after introduction of the helium gas was measured. The results are shown in Table 4.

Adsorptity after application of heat:

The above-mentioned electrostatic chucking devices A–F of the present invention and the electrostatic chucking devices G and H for comparison were each allowed to stand in a vacuum dryer at 200° C. for 1000 hours. After allowed to stand for cooling, the feed pressure of the helium gas was measured by the same manner as described above. The results are shown in Table 4.

TABLE 4

| | | Adsorptity (Pa) | |
|---|---|---|---|
| Electrostatic chucking device | Adhesive sheet | Before application of heat | After application of heat |
| A | Example 1 | 2900 | 2800 |
| B | Example 2 | 3100 | 3100 |
| C | Example 3 | 2900 | 2700 |
| D | Example 4 | 2900 | 2700 |
| E | Example 5 | 2800 | 2800 |
| F | Example 6 | 2900 | 2600 |
| G | Comparative Example 1 | 2900 | 13 |
| H | Comparative Example 2 | 2800 | 2600 |

As is clear from Table 4, the feed pressure of helium gas in the electrostatic chucking device using the adhesive sheet of Examples 1–6 hardly changed after application of heat. To the contrary, the feed pressure of helium gas in the electrostatic chucking device using the adhesive sheet of Comparative Examples 1 remarkably reduced after application of heat. This result showed that the electrostatic chucking device according to the present invention had sufficient adsorptity even after application of heat.

As is clear from the above-mentioned results, the adhesive sheet of the present invention has little curvature after application of heat. Moreover, the adhesive sheet of the present invention has very low percent thermogravimetric reduction and hardly generates gas by heating.

The electrostatic chucking device using the adhesive sheet of the present invention can hold sufficient adsorptity after application of heat at a high temperature for a long period of time.

What is claimed is:

1. An adhesive sheet for electrostatic chucking device which is used for producing the electrostatic chucking device having an adsorptive surface made of ceramic, said adhesive sheet being characterized by comprising a silicone resin elastic layer and two thermosetting adhesive layers containing an epoxy resin or a phenol resin, each of which is laminated on both sides of said silicone resin elastic layer.

2. An adhesive sheet for electrostatic chucking device according to claim 1, wherein said silicone resin elastic layer contains a filler.

3. An adhesive sheet for electrostatic chucking device according to claim 1, wherein a dynamic modulus in 0–125° C. of said silicone resin elastic layer is 0.1 MPa–30 MPa.

4. An adhesive sheet for electrostatic chucking device according to claim 1, wherein said adhesive layer contains at least one selected from the group consisting of polyamide resin, acrylonitrile-butadiene copolymer, polyester resin and polyimide resin, as an elastic component.

5. An adhesive sheet for electrostatic chucking device according to claim 4, wherein said polyimide resin is composed of a structural unit represented by the following formula (1) and a structural unit represented by the following formula (2):

(1)

(2)

wherein W is a direct bond, an alkylene group having 1–4 carbon atoms, —O—, —SO$_2$— or —CO—, Ar is a divalent aromatic group having 1–4 aromatic rings, $R^1$ and $R^6$ are each an alkylene group having 1–4 carbon atoms or a group represented by the following formula (3):

(3)

wherein Alk is an alkylene group having 1–4 carbon atoms which bonds to the silicone atom,

$R^1$–$R^5$ are each an alkyl group having 1–4 carbon atoms, and n is an integer of 0–32.

6. An adhesive sheet for electrostatic chucking device according to claim 5, wherein the structural unit represented by the above-mentioned formula (2) consists of the following formulas (2-1) and (2—2);

(2-1)

(2-2)

wherein W has the same meaning as the above mentioned definition, $Ar^1$ is a divalent aromatic group having 1–4 aromatic rings which have no hydroxyl group or carboxyl group, and $Ar^2$ is a divalent aromatic group having 1–4 aromatic rings which have one or two hydroxyl groups or carboxyl groups.

7. An adhesive sheet for electrostatic chucking device according to claim 5, wherein said polyimide resin comprises at least two sorts of polyimide resin, wherein at least one of polyimide resins is composed of the structural unit represented by the formula (1), the structural unit represented by the formula (2-1) and the structural unit represented by the formula (2—2), and the other polyamide resin is composed of the structural unit represented by the formula (1) and the structural unit represented by the formula (2-1).

8. An electrostatic chucking device having an adsorptive surface made of ceramic, which is characterized by that an electrode layer and a ceramic layer having an adsorptive surface are laminated in this order on a metal base via an adhesive sheet according to claim 1.

* * * * *